(12) United States Patent
Bedell et al.

(10) Patent No.: US 9,799,675 B2
(45) Date of Patent: Oct. 24, 2017

(54) STRAIN ENGINEERING IN BACK END OF THE LINE

(71) Applicant: INTERNATIONAL BUSINESS MACHINES CORPORATION, Armonk, NY (US)

(72) Inventors: Stephen W. Bedell, Wappingers Falls, NY (US); Wilfried E. Haensch, Somers, NY (US); Bahman Hekmatshoartabari, White Plains, NY (US); Ghavam G. Shahidi, Pound Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/243,385

(22) Filed: Apr. 2, 2014

(65) Prior Publication Data
US 2015/0287740 A1 Oct. 8, 2015

(51) Int. Cl.
| H01L 27/12 | (2006.01) |
| H01L 29/786 | (2006.01) |
| H01L 29/78 | (2006.01) |
| H01L 21/683 | (2006.01) |
| H01L 21/762 | (2006.01) |
| H01L 21/84 | (2006.01) |
| H01L 21/8238 | (2006.01) |

(52) U.S. Cl.
CPC ...... *H01L 27/1203* (2013.01); *H01L 21/6835* (2013.01); *H01L 21/7624* (2013.01); *H01L 21/84* (2013.01); *H01L 29/7843* (2013.01); *H01L 29/7845* (2013.01); *H01L 29/7848* (2013.01); *H01L 29/7849* (2013.01); *H01L 29/78603* (2013.01); *H01L 29/78618* (2013.01); *H01L 29/78654* (2013.01); *H01L 21/823807* (2013.01); *H01L 2221/68327* (2013.01); *H01L 2221/68381* (2013.01)

(58) Field of Classification Search
CPC .................................................. H01L 29/7849
See application file for complete search history.

(56) References Cited

U.S. PATENT DOCUMENTS

| 6,383,904 B1 * | 5/2002 | Yu ........................ H01L 29/4908 |
| | | 257/347 |
| 6,809,380 B2 | 10/2004 | Matsuhashi |
(Continued)

OTHER PUBLICATIONS

Claassen, W., et al. "Influence of Deposition Temperature, Gas Pressure, Gas Phase Composition, and RF Frequency on Composition and Mechanical Stress of Plasma Silicon Nitride Layers". J. Electrochem. Soc. Apr. 1985. vol. 132. Issue 4. pp. 893-898.

(Continued)

*Primary Examiner* — Erik Kielin
(74) *Attorney, Agent, or Firm* — Tutunjian & Bitetto, P.C.; Louis J. Percello

(57) ABSTRACT

A semiconductor device including at least one semiconductor device on a first surface of a dielectric layer, and at least one stressor structure having an intrinsic stress on a second surface of the dielectric layer. The at least one semiconductor device and the at least one stressor structure are present on opposing sides of the dielectric layer. The at least one stressor structure induces a stress on the at least one semiconductor device opposite the intrinsic stress.

4 Claims, 11 Drawing Sheets

(56) References Cited

U.S. PATENT DOCUMENTS

| | | | |
|---|---|---|---|
| 7,704,839 B2 | 4/2010 | Ieong et al. | |
| 7,888,197 B2 | 2/2011 | Chidambarrao et al. | |
| 7,897,444 B2 | 3/2011 | Adam et al. | |
| 8,395,213 B2 | 3/2013 | Clifton et al. | |
| 2006/0234428 A1* | 10/2006 | Furukawa | H01L 21/84 438/149 |
| 2007/0138559 A1* | 6/2007 | Bohr | H01L 21/28088 257/351 |
| 2008/0206977 A1* | 8/2008 | Frank | H01L 21/768 438/597 |
| 2008/0286918 A1* | 11/2008 | Shaviv | H01L 21/823412 438/211 |
| 2009/0294813 A1* | 12/2009 | Gambino | H01L 27/14632 257/292 |
| 2010/0307572 A1 | 12/2010 | Bedell et al. | |
| 2010/0311250 A1 | 12/2010 | Bedell et al. | |
| 2011/0012199 A1* | 1/2011 | Nygaard | H01L 21/84 257/347 |
| 2011/0233688 A1* | 9/2011 | Ren | H01L 21/84 257/408 |
| 2012/0049280 A1 | 3/2012 | Clifton et al. | |
| 2012/0139044 A1* | 6/2012 | Zhu | H01L 29/78648 257/347 |
| 2012/0313168 A1* | 12/2012 | Cheng | H01L 29/66772 257/347 |
| 2012/0318334 A1* | 12/2012 | Bedell | H01L 31/076 136/255 |
| 2013/0015526 A1* | 1/2013 | Liang | H01L 27/1203 257/351 |
| 2015/0076602 A1* | 3/2015 | Zhu | H01L 21/26506 257/347 |
| 2015/0187942 A1* | 7/2015 | Zhu | H01L 29/66242 257/347 |
| 2015/0270399 A1* | 9/2015 | Zhu | H01L 21/26506 257/347 |

OTHER PUBLICATIONS

Detor, A., et al. "Stress and microstructure evolution in thick sputtered films". Acta Materialia. Apr. 2009. vol. 57, Issue 7. pp. 2055-2065.

* cited by examiner

STRAIN ENGINEERING IN BACK END OF THE LINE

BACKGROUND

Technical Field

The present invention relates to semiconductor devices, and more particularly to strain based performance enhancements in semiconductor devices.

Description of the Related Art

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFET performance and consequently the overall performance of the complementary metal oxide semiconductor (CMOS) circuits through continued scaling, methods for improving performance without scaling have become critical. One method for increasing device performance is to introduce strain inducing materials to the semiconductor device.

SUMMARY

In one embodiment, a semiconductor device is provided that includes at least one semiconductor device on a first surface of a dielectric layer, and at least one stressor structure having an intrinsic stress on a second surface of the dielectric layer. The at least one semiconductor device and the at least one stressor structure are present on opposing sides of the dielectric layer. The at least one stressor structure induces a stress on the at least one semiconductor device opposite the intrinsic stress.

In another embodiment, a structure is provided that includes a semiconductor device on a first surface of a dielectric layer, wherein the semiconductor device includes an active region that is present in direct contact with the dielectric layer. A first gate structure of the semiconductor device is present on a channel region portion of the active region. A metal stressor structure is present on a second surface of the dielectric layer so that the stressor structure and the semiconductor device are on opposing sides of the dielectric layer. A semiconductor layer is present on the second surface of the dielectric layer, in which the metal stressor structure is present between the semiconductor layer and the dielectric layer. The semiconductor layer includes a doped well region in electrical communication with the metal stressor structure. The metal stressor structure and the dielectric layer provide a second gate structure to the semiconductor device.

In another aspect, a method of forming a semiconductor device is provided. In one embodiment, the method includes forming at least one semiconductor device on a first surface of a dielectric layer and forming at least one stressor structure on a second surface of the dielectric layer. The second surface of the dielectric layer is opposite the first surface of the dielectric layer so that the at least one stressor structure and the at least one semiconductor device are present on opposing sides of the dielectric layer. The at least one stressor structure induces a stress in the at least one semiconductor device.

BRIEF DESCRIPTION OF DRAWINGS

The disclosure will provide details in the following description of preferred, embodiments with reference to the following figures wherein.

DETAILED DESCRIPTION OF PREFERRED EMBODIMENTS

Figure 1:
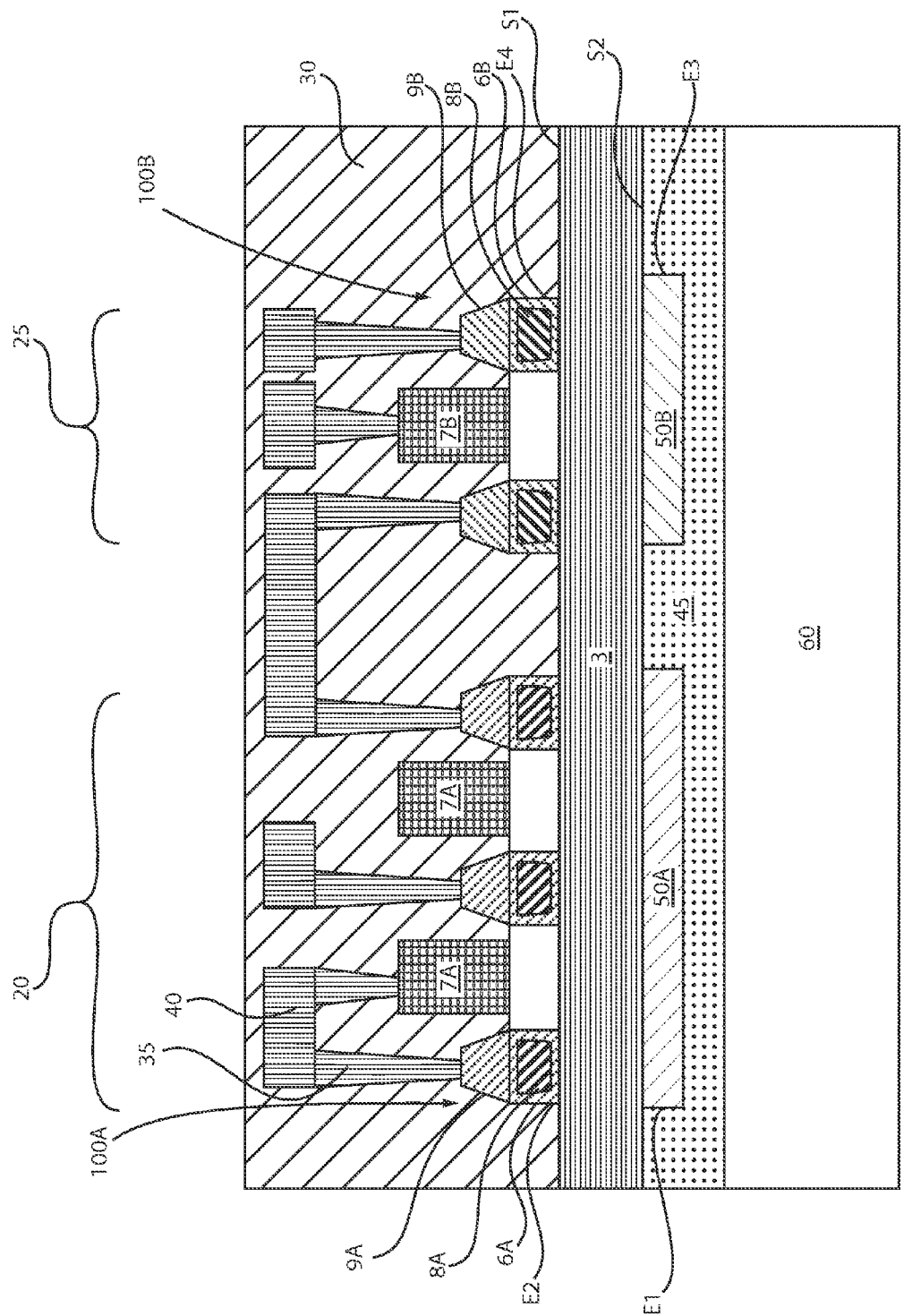
FIG. 1 is a side cross-sectional view depicting one embodiment of semiconductor devices that are present on a first surface of a dielectric layer, wherein at least one stressor structure is present on a second opposing surface of the dielectric layer so that the semiconductor devices and stressor structures are on opposing sides of the dielectric layer, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second, structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein are related to stress based electrical performance enhancements of semiconductor devices. Embedded source and drain stressor well structures, such as silicon germanium (SiGe) and silicon doped with carbon (Si:C) well structures, and nitride stress liners have been the main driver to enhance the earner transport properties in the channel for semiconductor devices, such as field effect transistors. It has been determined that the aggressive reduction of the transistor dimensions from one generation to another has diminished the effectiveness of these performance boosters. Additionally, these performance boosters are even less effective when applied to fully depleted thin-body transistors, such as planar extremely thin semiconductor on insulator (ETSOI) substrates. In some embodiments, the methods and structures disclosed herein may overcome at least some of the aforementioned disadvantages by employing stressor structures, such as compressive and tensile stressor structures, to an underlying surface of semiconductor devices during back end of the line (BEOL) processing. BEOL processing typically occurs after the formation of interconnects and vias that provide electrical communication to the semiconductor devices.

FIG. 1 depicts one embodiment of semiconductor devices 100a, 100b that are present on a first surface S1 of a dielectric layer 3, wherein at least one stressor structure 50a, 50b is present on a second opposing surface S2 of the dielectric layer 3 so that the semiconductor devices 100a, 100b and stressor structures 50a, 50b are present on the opposing sides of the dielectric layer 3. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole earner concentrations of the intrinsic semiconductor at thermal equilibrium. Dominant carrier concentration in an extrinsic semiconductor determines the conductivity type of the semiconductor. For example, when the dominant earner concentration is electrons, the semiconductor device is referred to as being an n-type semiconductor device; and when the dominant carrier concentration is holes, the semiconductor device is referred to as being a p-type semiconductor device.

In one embodiment, the semiconductor devices 100a, 100b suitable for use with methods and structures disclosed herein are field effect transistors (FETs). A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, the term "drain" means a doped region in semiconductor device located, at the end of the channel region, in which carriers are flowing out of the transistor through the dram. The term "source" is a doped region in the semiconductor device, in which majority carriers are flowing into the channel region. The channel region is the region underlying the gate structure and between the source and drain of a semiconductor device that becomes conductive when the semiconductor device is turned on.

It is noted that the semiconductor devices 100a, 100b are not limited to only field effect transistors. Any planar semiconductor device is suitable for use with the methods and structures that are disclosed herein. The term "planar" as used to describe a semiconductor device orientation denotes that the direction of charge carriers from the source region to the drain region of the semiconductor device is along a plane that is parallel to the upper surface of the substrate, wherein a gate structure is present on the upper surface of the substrate. For example, the planar semiconductor device that is suitable for use with the present application includes field effect transistors (FET), junction field effect transistors (JFET), Schottky barrier devices, bipolar junction transistors having the appropriate planar orientation, flash memory devices combinations thereof.

A stressor structure 50a, 50b is a structure having an intrinsic stress, such as an intrinsic compressive stress or intrinsic tensile stress, which induces an opposing stress on an device structure. The term "intrinsically stressed" or "intrinsic stress" as used, herein refers to a stress or presence of a stress, either compressive or tensile, which is developed during preparation of a structure and can therefore be retained in the structure without external force, in contrast to an extrinsic stress that is applied to a structure by an external force and can only be maintained by the external force. By inducing an opposing stress on an adjacent structure it is meant that if the stressor structure 50a has an intrinsic tensile stress, 50a will be inducing a compressive stress on the device structure atop the stressor; and if the stressor structure 50a has an intrinsic compressive stress, the stressor structure 50a will be inducing a tensile stress on the device structure atop the stressor.

FIG. 1 depicts one embodiment of a device including a first conductivity type semiconductor device 100a (hereafter referred to as p-type conductivity type device 100a) on a first region 20 of the first surface S1 of the dielectric layer 3 and a second conductivity type semiconductor device 100b (hereafter referred to as an n-type conductivity type device) on a second region 25 of the first surface S1 of the dielectric layer 3. The p-type conductivity semiconductor device 100a may be a field effect transistor (FET) including source and drain regions 6 that are doped to a p-type conductivity, and a gate structure 7a that is present on the channel portion of the device between the source and drain regions 6a, in the embodiment depicted in FIG. 1, raised source and drain region structures 9a are present on the source and drain regions 6a of the p-type conductivity semiconductor device 100a.

The p-type conductivity semiconductor device 100a may include a compressive stress inducing structure present therein. For example, to increase the hole carrier speed within the channel region of a p-type conductivity semiconductor device 100a, the stress inducing structure induces a compressive stress on the device channel. The stress inducing structure may be well regions 8a comprised a compressive material on opposing sides of the channel region. For example, when the first semiconductor portion 4a that the p-type conductivity semiconductor device 100a is formed on is composed of silicon (Si), a compressive stress inducing well region 8a present in the source and drain regions 6a may be composed of silicon germanium (SiGe). In another embodiment, the stress inducing structure may be a stress inducing dielectric layer (not shown) that is deposited over the gate structure 7a and the source and drain regions 6a. Similar to the compressive stress including well region 8a, the stress inducing dielectric layer that is present over the p-type conductivity semiconductor device 100a may induce a compressive stress on the channel region of the p-type conductivity semiconductor device 100a In some other embodiments, the gate conductor of the gate structure 7a may be composed of a metal that includes a compressive stress on the channel region portion of the p-type conductivity semiconductor device 100a In some embodiments, the stress inducing structure of the p-type conductivity semiconductor device 100a may be a metal gate conductor that induces a compressive stress in the channel region portion of the p-type conductivity semiconductor device 100a.

The n-type conductivity semiconductor device 100b may include a tensile stress inducing structure present therein. For example, to improve the electron carrier transport properties within the channel region of a n-type conductivity semiconductor device 100b, the stress inducing structure induces a tensile stress on the device channel. The stress inducing structure may be well regions comprised of a tensile stress inducing material on opposing sides of the channel region. For example, when the second, semiconductor portion 4b that the n-type conductivity semiconductor device 100b is formed on is composed of silicon (Si), a tensile stress inducing well region 8b present in the source and drain regions 6b may be composed of silicon doped with carbon (Si:C), wherein the carbon content is less than 5 at. %. In another embodiment, the stress inducing structure may be a stress inducing dielectric layer (not shown) that is deposited over the gate structure 7b and the source and dram regions 6b. Similar to the tensile stress including well region 8b, the stress inducing dielectric layer that is present over the n-type conductivity semiconductor device 100b may induce a tensile stress on the channel region of the n-type conductivity semiconductor device 100b. In some other embodiments, the gate conductor of the gate structure 7b may be composed of a metal that includes a tensile stress on the channel region portion of the n-type conductivity semiconductor device 100b. In some embodiments, the stress inducing structure of the n-type conductivity semiconductor device 100b may be a metal gate conductor that induces a tensile stress in the channel region portion of the n-type conductivity semiconductor device 100b.

As depicted in FIG. 1, the p-type conductivity semiconductor device 100a and the n-type conductivity semiconductor device 100b are present on a first surface S1 of the dielectric layer 3, wherein a first and second stressor structure 50a, 50b are present on an opposing surface S2 of the dielectric layer. In one embodiment, the first stressor structure 50a is present in the first device region 20 underlying the p-type conductivity semiconductor device 100a, and induces a compressive stress on the channel region portion of the p-type conductivity semiconductor device 100a To induce a compressive stress on the channel portion of the p-type conductivity semiconductor device 100a, the first stressor structure 50a is composed of a material having an intrinsic tensile stress. For example, the first stressor structure 50a may be composed of a dielectric, such as Silicon nitride, silicon oxynitride or combinations thereof, or the first stressor structure 50a may be composed of a metal such as nickel, chromium, titanium, molybdenum or combinations thereof. The first stressor structure 50a is present underlying the p-type semiconductor devices 100a so that the first stressor structure 50a and the p-type conductivity semiconductor devices 100a are substantially aligned to one another. In some embodiments, the sidewalls E1 for the edges of the first stressor structure 50a are substantially aligned with the side-walls E2 of the edge of the first semiconductor portion 4a that the p-type conductivity semiconductor device 100a is present on.

In one embodiment, the compressive stress that is induced in the channel portion of the p-type conductivity semiconductor devices 100a by the first stressor structure 50a may range from 100 MPa to 2000 MPa. In another embodiment, the compressive stress that is induced in the channel portion of the p-type conductivity semiconductor devices 100a by the first stressor structure 50a may range from 200 MPa to 1500 MPa. In yet another embodiment, the compressive stress that is induced in the channel portion of the p-type conductivity semiconductor devices 100a by the first stressor structure 50a may range from 500 MPa to 1000 MPa.

In one embodiment, the second stressor structure 50b is present in the second device region 25 underlying the n-type conductivity semiconductor device 100b, and induces a tensile stress on the channel region portion of the n-type conductivity semiconductor device 100b. To induce a tensile stress on the channel portion of the n-type conductivity semiconductor device 100b, the second stressor structure 50b is composed of a material having an intrinsic compressive stress. For example, the second stressor structure 50b may be composed of a dielectric, such as silicon nitride, silicon oxynitride, or combinations thereof, or the second stressor structure 50b may be composed of a metal such as nickel, molybdenum, titanium or combinations thereof.

The second stressor layer 50b is present underlying the n-type conductivity semiconductor devices 100b so that they are substantially aligned to one another. In some embodiments, the sidewalls E3 for the edges of the second stressor structure 50b are roughly aligned with the sidewalls E4 of the edge of the second semiconductor portion 4b that the n-type conductivity semiconductor device 100b is present on.

In one embodiment, the tensile stress that is induced in the channel portion of the n-type conductivity semiconductor devices 100b by the second stressor structure 50b may range from 100 MPa to 2000 MPa. In another embodiment, the tensile stress that is induced in the channel portion of the n-type conductivity semiconductor devices 100b by the second stressor structure 50b may range from 200 MPa to 1500 MPa. In yet another embodiment, the tensile stress that is induced in the channel portion of the n-type conductivity semiconductor devices 100b by the second stressor structure 50b may range from 500 MPa to 1000 MPa.

Referring to FIG. 1, an interlevel dielectric layer 30 is then formed on the first surface S1 of the dielectric layer 3 positioning the p-type conductivity semiconductor device 100a and the n-type conductivity semiconductor layer 100b between the dielectric layer 3 and the interlevel dielectric layer 30. Metal vias 35 and lines 40 may be present in the interlevel dielectric layer 30 providing electrical communication to the p-type conductivity semiconductor device 100a and the n-type conductivity semiconductor device 100b. A bonding layer 45 may be present on the second surface S2 of the dielectric layer 3 positioning the first and second stressor structures 50a, 50b between the bonding layer 45 and the dielectric layer 3. The bonding layer 45 is typically a dielectric material, which may include an adhesive bonding to a support substrate 60. The support substrate 60 may be composed of a metal, polymer, glass, semiconductor, dielectric or a combination of the aforementioned materials.

Figure 2:
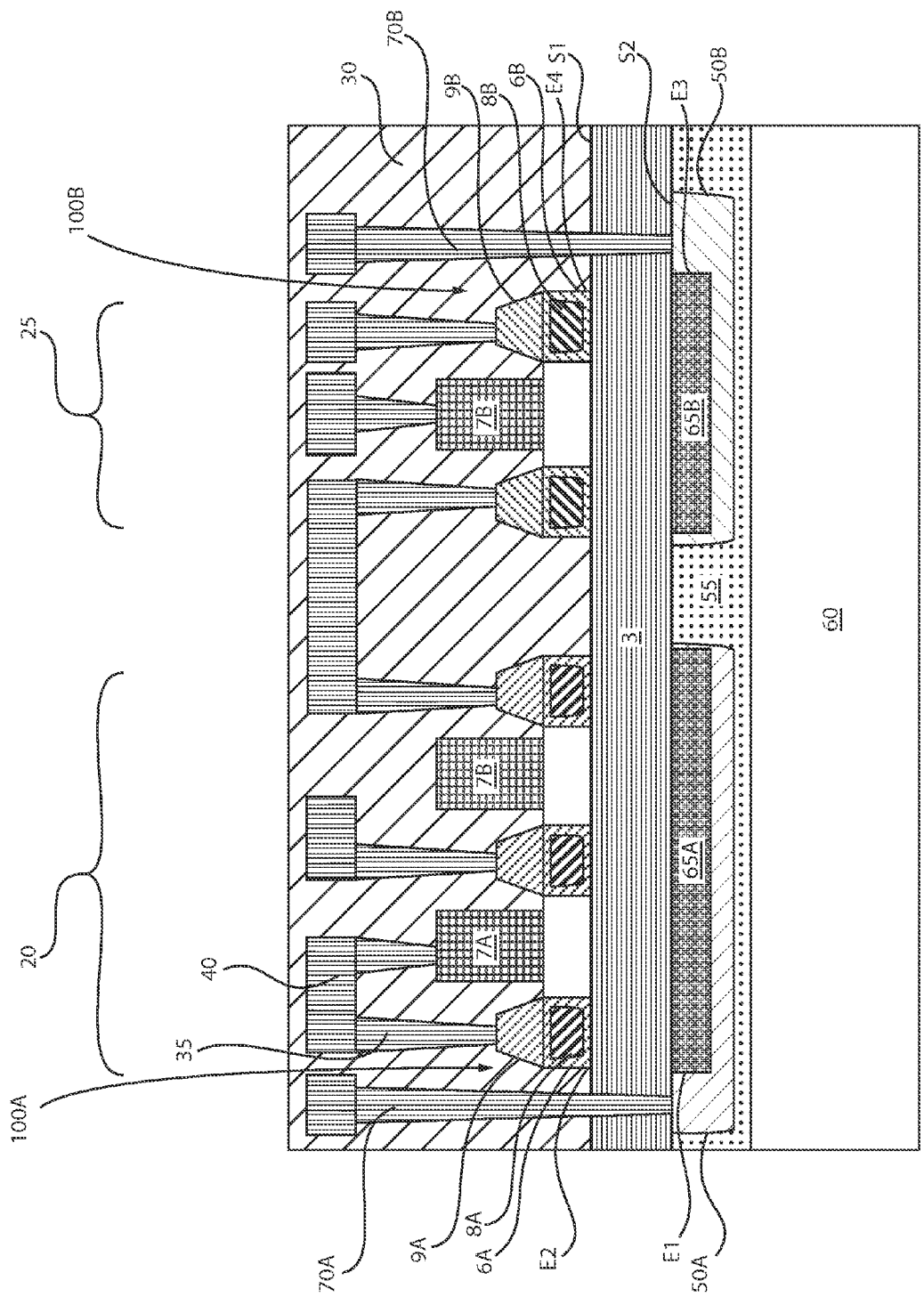
FIG. 2 is a side cross-sectional view depicting another embodiment of a structure including semiconductor devices in accordance with the present disclosure, wherein semiconductor devices and stressors structures are on opposing sides of the dielectric layer, and the stressors structures also function as the gate conductors of back gate structures for the semiconductor devices.

FIG. 2 depicts another embodiment of a structure including semiconductor devices in accordance with the present disclosure, wherein semiconductor devices 100a, 100b and stressors structures 50a, 50b are on opposing sides of the dielectric layer 3, and the stressors structures 50a, 50b also function as back gate structures for the semiconductor devices 100a, 100b. In one embodiment, each of the semiconductor devices 100a, 100b are on a first surface S1 of a dielectric layer 3. For example, a p-type conductivity semiconductor device 100a may be present on the first surface S1 of the dielectric layer 3 in a first region 20, and an n-type semiconductor device 100b may be present on the first surface S1 of the dielectric layer 3 in a second region 25. In some embodiments, each of the p-type conductivity type semiconductor device 100a and the n-type conductivity type semiconductor device 100b include an active region within a semiconductor portion 4a 4b including the channel region and the source and drain regions 6a, 6b that is present in direct contact with the dielectric layer 3. A first gate structure 7a, 7b is present on a channel region portion of the active region for each of the p-type conductivity semiconductor device 100a and the n-type conductivity semiconductor device 100b.

The p-type conductivity semiconductor device 100a and the n-type semiconductor device 100b that are depicted in FIG. 2 are similar to the p-type conductivity semiconductor device 100a and the n-type semiconductor device 100b that are depicted in FIG. 1. Therefore the description of the p-type conductivity semiconductor device 100a and the n-type semiconductor device 100b depicted in FIG. 1, including the source and drain regions 6a, 6b, gate structures 7a, 7b, raised source and drain region structures 9a, 9b, is suitable for the p-type conductivity semiconductor device 100a and the n-type semiconductor device 100b that are depicted in FIG. 2. Further, the stress inducing structures, such as the stress inducing wells 8a, 8b, stress inducing dielectric liners, and stress inducing gate structures, that are described above with reference to FIG. 1, are equally applicable to the p-type conductivity semiconductor device 100a and the n-type semiconductor device 100b that are depicted in FIG. 2.

The stressor structures 50a, 50b that are depicted in FIG. 2 are metal containing stressor structures that function as a back gate structure to the p-type conductivity semiconductor device 100a and the n-type semiconductor device 100b, in addition to inducing a stress to the channel region of the devices to increase carrier injection velocity into the channel. Similar to the stressor structures 50a, 50b depicted in FIG. 1, the stressor structures depicted in FIG. 2 are present on a second surface S2 of the dielectric layer 3 so that the stressor structures 50a, 50b and the semiconductor devices 100a, 100b are on opposing sides of the dielectric layer 3. As indicated above, to provide back gate structures, the stressor structures 50a, 50b depicted in FIG. 2 are composed of a conductive material, such as a metal or Silicides.

In some embodiments, a first stressor structure 50a having an intrinsic tensile stress induces a compressive stress on at least a channel region portion of the p-type conductivity semiconductor device 100a, wherein the first stressor structure 50a is composed of a metal selected from the group consisting of nickel, chrome, titanium, molybdenum and combinations thereof. In one example, the compressive strain that is induced to the channel region portion of the p-type conductivity semiconductor device 100a by the first stressor structure 50a may range from 20 MPa to 2000 MPa. In some embodiments, the second stressor structure 50b having an intrinsic compressive stress induces a tensile stress on at least a channel region portion of the n-type semiconductor device 100b, wherein the second stressor structure 50b is a composed of a metal selected from the group consisting of nickel, titanium, molybdenum and combinations thereof. In one example, the tensile strain that is induced to the channel region portion of the n-type conductivity semiconductor device 100b by the second stressor structure 50b may range from 20 MPa to 2000 MPa. The description of the interlevel dielectric 30, metal vias 35 and lines 40 depicted in FIG. 1 are suitable for the description of the interlevel dielectric 30, metal vias 35 and lines 40 that are depicted in FIG. 2.

Referring to FIG. 2, a dielectric layer 55 is present on the second surface S2 of the dielectric layer 3, wherein the metal stressor structures 50a, 50b are positioned between the dielectric layer 55 and the doped well regions 65a and 65b, respectively. The dielectric layer 55 may be composed of materials, such as silicon dioxide, silicon nitride or high-k metal oxides or may be composed of polymeric elastomers. The dielectric layer 55 depicted in FIG. 2 is substituted for the bonding layer 45 that is depicted in FIG. 1. The dielectric layer 55 encapsulates doped well regions 65a, 65b in electrical communication with the metal stressor structures 50a, 50b. The doped well regions 65a, 65b are electrically conductive and provide for electrical communication to the metal stressor structures 50a, 50b. In some embodiments, the doped well regions 65a, 65b are doped with an n-type dopant, such as arsenic or phosphorous in a type IV semiconductor. The metal stressor structures 50a, 50b and the dielectric layer 3 provide a second gate structure to the semiconductor devices, i.e., the p-type conductivity semiconductor device 100a and the n-type conductivity type semiconductor device 100b.

Electrical communication from the top side of the p-type conductivity semiconductor device 100a to the back gate conductor, i.e., metal stressor structure 50a, of the back gate structure to the p-type conductivity semiconductor device 100a may be provide by the metal stud 70a that extends from the interlevel dielectric 30 through the dielectric layer 3 to the back gate conductor, i.e., layer 65a Electrical communication from the top side of the n-type conductivity semiconductor device 100b to the back gate conductor, i.e., layer 65b, of the back gate structure to the n-type conductivity semiconductor device 100b may be provide by the metal stud 70b that extends from the interlevel dielectric 30 through the dielectric layer 3 to the back gate conductor, i.e., layer 65b.

Figure 3:
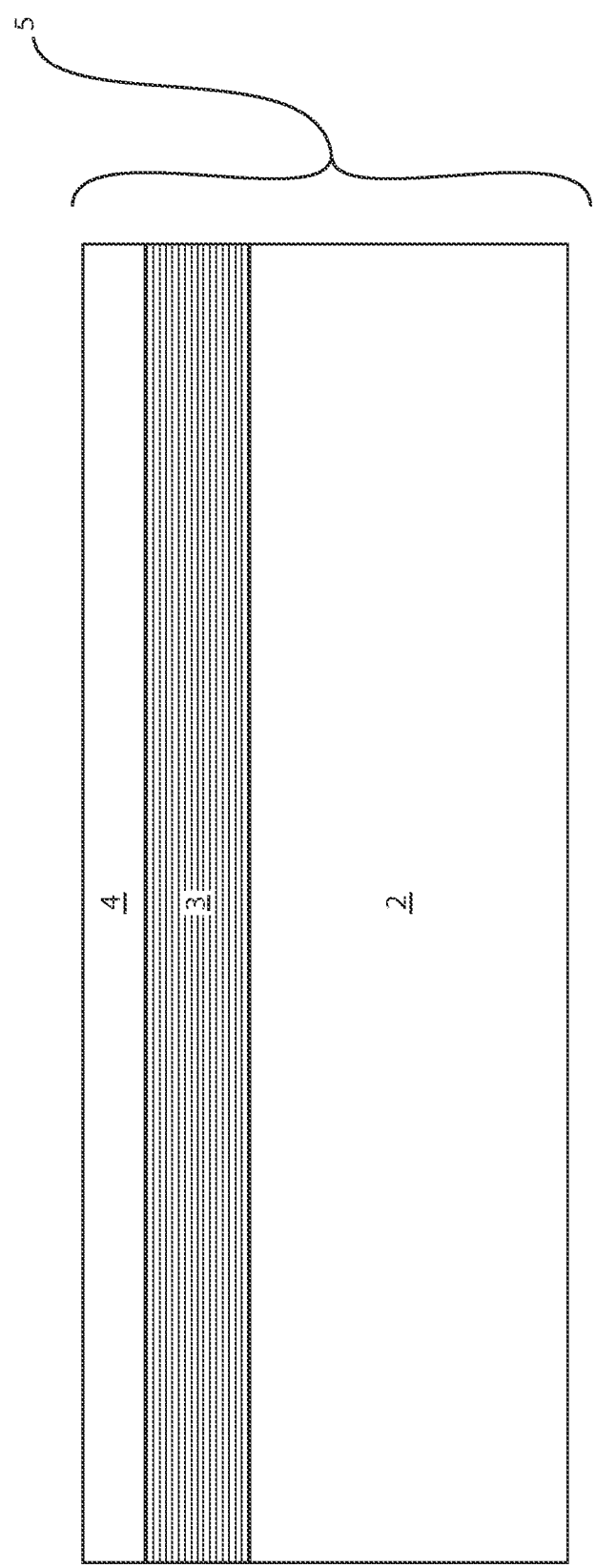
FIG. 3 is a side cross-sectional view of a semiconductor on insulator (SOI) substrate, in accordance with one embodiment of the present disclosure.

The structures depicted in FIGS. 1 and 2 are now described in more detail in the following description of a method for forming a semiconductor device with reference to FIGS. 3-10B. FIG. 3 depicts one embodiment of a semiconductor on insulator (SOI) substrate 5 for use with the methods and structures of the present disclosure. In one embodiment, the SOI substrate 5 has a first semiconductor layer 4 (hereafter referred to as SOI layer 4) atop a buried insulator layer 3 (hereafter referred to as dielectric layer 3) which is positioned on top of a base semiconductor layer 2. The SOI layer 4 may be formed using any semiconductor material including, but not limited to Si, SiGe, SiGeC, SiC. Ge alloys, GaSb, GaP, GaAs, InAs, InP, and all other III-V or II-VI compound semiconductors, or a combination thereof. In one embodiment, SOI layer 4 is silicon (Si) or silicon germanium (SiGe), and has a thickness between 3 and 200 nm. The base semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors. The base semiconductor layer 2 may have the same or a different composition than the SOI layer 4.

The dielectric layer 3 may be composed of an oxide, nitride or oxynitride material. For example, the dielectric layer 3 may be composed of silicon oxide ($SiO_2$) or silicon oxynitride. In some embodiments, the dielectric layer 3 may be a multilayered structure including at least one layer composed of a high-k dielectric. The term "high-k", as used herein, denotes a dielectric constant that is greater than the dielectric constant of silicon oxide, which is typically equal to 4 (i.e., typically a silicon oxide) measured in vacuum at room temperature (20° C. to 25° C.). Such higher dielectric constant dielectric materials may include, but are not limited to hafnium, oxides, hafnium silicates, zirconium oxides, lanthanum oxides, titanium oxides, barium-strontium-titantates (BSTs) and lead-zirconate-titanates (PZTs).

The dielectric layer 3 that may be present underlying the SOI layer 4 and atop the base semiconductor layer 2 may be formed by implanting a high-energy dopant into a bulk semiconductor substrate and then annealing the structure to form a buried insulating layer, i.e., dielectric layer 3. In another embodiment, the dielectric layer 3 may be deposited or grown prior to the formation of the SOI layer 4. In yet another embodiment, the SOI substrate 5 may be formed using wafer-bonding techniques, where a bonded water pair is formed utilizing glue, adhesive polymer, or direct bonding. The dielectric layer 3 may have a thickness between 5 and 1000 nm. In some embodiments, the dielectric layer 3 may have a thickness ranging from 10 nm to 150 nm. In yet another embodiment, the dielectric layer may have a thickness ranging from 5 nm to 50 nm.

In some embodiments, the SOI substrate is an extremely thin semiconductor on insulator (ETSOI) substrate. An "ETSOI substrate" is a semiconductor on insulator (SOI) substrate, in which the SOI layer 4 has a thickness of 10 nm or less. In some embodiments, the SOI layer 4 of the ETSOI substrate has a thickness ranging from 2 nm to 10 nm. In other embodiments, the SOI layer 4 of the ETSOI substrate has a thickness ranging from 3 nm to 8 nm. The ETSOI substrate can be formed by any of the methods known in art, for example using separation by implanted oxide (SIMOX) process, where oxygen ions are implanted into a silicon substrate at a desired depth. In yet another method, the semiconductor-on-insulator substrate is formed by Smart Cut process or alternatively by wafer bonding and thinning.

It is noted that the SOI substrate 5 used in the present disclosure is not limited to being an SOI substrate, as depicted in FIG. 3. For example, a bulk semiconductor substrate is suitable for use in the present disclosure so long as a dielectric layer 3 and semiconductor layer 4 are deposited thereon.

Figure 4:
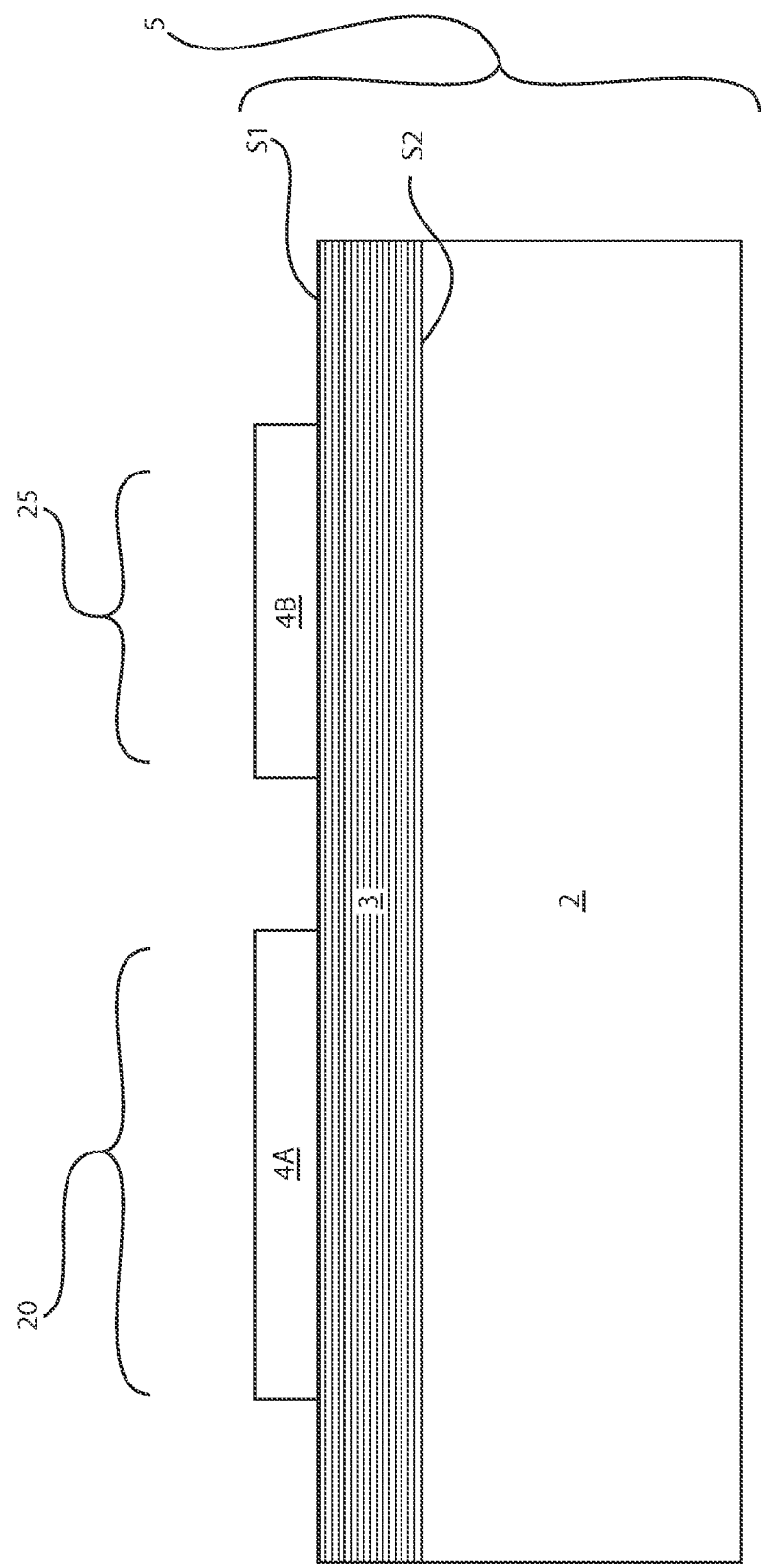
FIG. 4 is a side cross-sectional view depicting one embodiment of patterning the SOI substrate to provide a first semiconductor portion in a first device region and a second semiconductor portion in a second device region, in accordance with the present disclosure.

FIG. 4 depicts one embodiment of patterning the SOI layer of the SOI substrate 5 to provide a first semiconductor portion 4a in a first region 20 of the dielectric layer 3 and a second semiconductor portion 4b in a second region 25 of the dielectric layer 3. The first semiconductor portion 4a and the second semiconductor portion 4b are defined using photolithography and etch processes. More specifically, in some embodiments, a layer of photoresist material is first deposited atop the entire SOI layer. The photoresist layer is then selectively exposed to light and developed to pattern an etch mask, protecting the portions of the SOI layer that provide the first semiconductor portion 4a and the second semiconductor portion 4b. The exposed, portions of the SOI layer are then etched, while the portions of the SOI layer underlying the etch mask are protected to provide the first semiconductor portion 4a and the second semiconductor portion 4b. The etch process for removing the exposed portions of the SOI layer may be an anisotropic etch, such as reactive ion etch (RIE). The etch process may be selective to the dielectric layer 3, as well as being selective to the etch mask. The etch mask may be removed hollowing formation of the first semiconductor portion 4a and the second semiconductor portion 4b.

Figure 5:
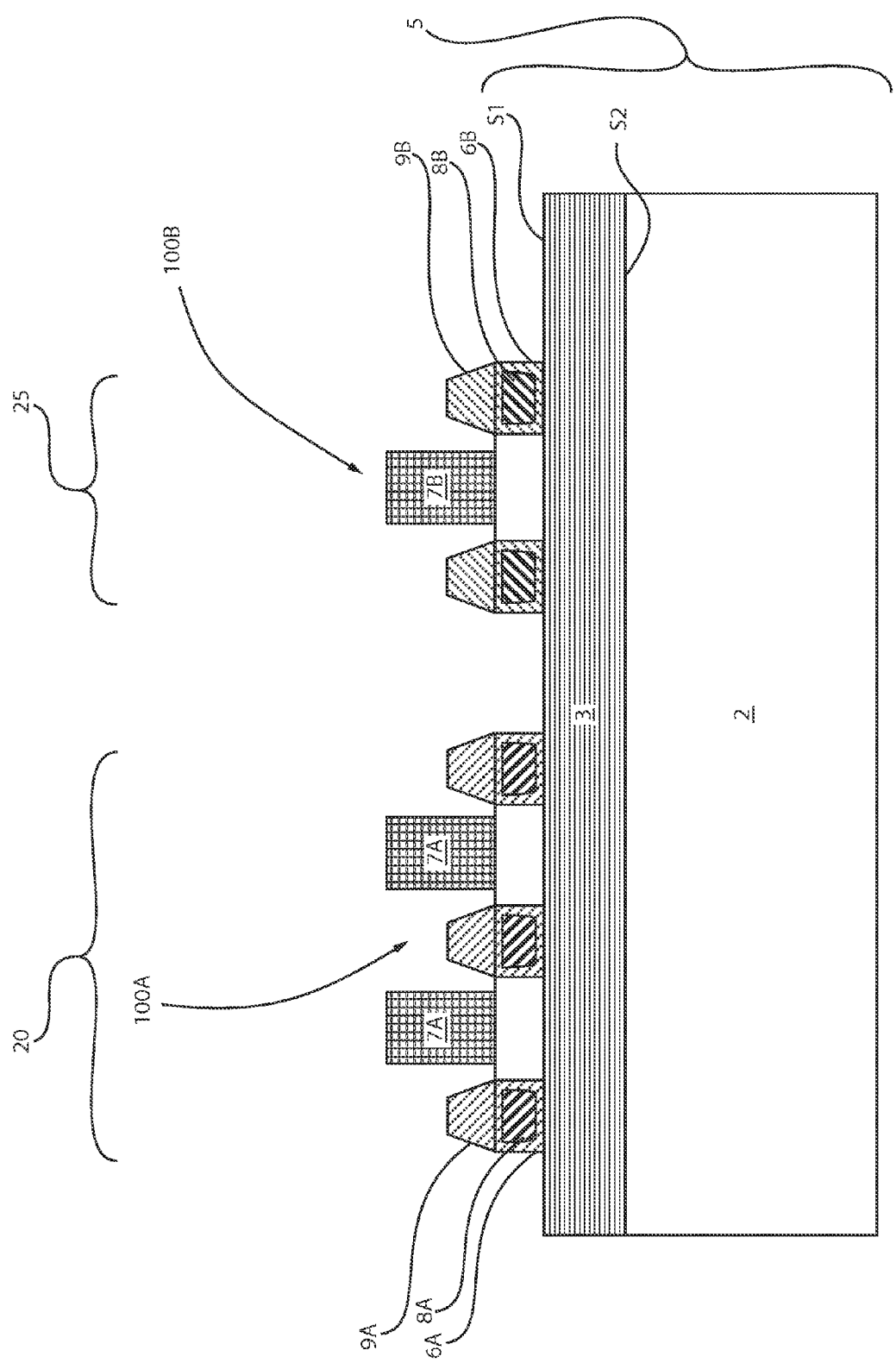
FIG. 5 is a side cross-sectional view depicting forming a first conductivity type semiconductor devices on the first semiconductor portion in the first region of a dielectric layer and forming second conductivity type semiconductor devices on the second semiconductor portion in the second region of the dielectric layer, in accordance with the present disclosure.

FIG. 5 depicts one embodiment of forming at least one first conductivity type semiconductor devices 100a on the first semiconductor portion 4a the first device region 20 of the substrate 5 and forming at least one second conductivity type semiconductor device 100b on the second semiconductor portion 4b in the second device region 25 of the substrate 5. The term "conductivity type" denotes whether the semiconductor device has a p-type conductivity or an n-type conductivity. A semiconductor device having an n-type conductivity includes a majority of electron charge carriers, and a semiconductor having a p-type conductivity includes a majority of hole charge carriers. In some embodiments, the first conductivity semiconductor device 100a has a p-type conductivity (hereafter referred to as p-type conductivity semiconductor device 100a, and the second conductivity semiconductor device 100b has an n-type conductivity (hereafter referred to as an n-type conductivity semiconductor device 100b). In the embodiment depicted in FIG. 5 each of the semiconductor devices 100a, 100b include source and drain regions 6a, 6b and a gate structure 7a, 7b.

The term "gate structure" means a structure used to control output current from source to drain (i.e., flow of carriers in the channel) of a semiconducting device. Each of the gate structures 7a, 7b Air semiconductor devices of the field effect transistor type include at least one gate dielectric that is present on the channel portion of the semiconductor device and at least one gate conductor that is present on the at least one gate conductor. The gate dielectrics may be composed of a dielectric material, such as an oxide, nitride or oxynitride material. For example, the at least one gate dielectric may be composed, of silicon oxide. The gate dielectrics may include high-k materials that may include may include, but are not limited to hafnium oxides, hafnium silicates, zirconium oxides, lanthanum oxides, titanium oxides, barium-strontium-titantates (BSTs) and lead-zircon-ate-titanates (PZTs). The gate conductor may be composed of an electrically conductive material, such as a doped semiconductor or a metal. For example, the gate conductor may be composed of n-type doped polysilicon. In other examples, the gate conductor may be composed of a metal having a work function suitable for enhancing the electrical properties of n-type or p-type semiconductor devices.

In some embodiments, the gate conductor may be composed of material that induces a compressive or tensile stress on underlying channel portion of the semiconductor device. For example, in the p-type conductivity semiconductor device 100a, the gate conductor may be composed of a material, such as a metal, semiconductor or metal semiconductor alloy, e.g., silicide, that includes a compressive stress on the channel region portion of the device. In another example, in the n-type conductivity semiconductor device 100b, the gate conductor may be composed of a material, such as a metal, semiconductor or metal semiconductor alloy, e.g., silicide, that includes a tensile stress on the channel region portion of the device. Some examples of stress inducing metal semiconductor alloys that are suitable for use as gate conductors include nickel silicide and cobalt silicide. Further details on forming stress inducing gate conductors are found in U.S. Pat. No. 7,470,943 titled "High performance MOSFET comprising a stressed gate metal silicide layer and method of fabricating the same", which is incorporated herein by reference in its entirety.

The gate structures 7a, 7b are typically formed using photolithography and etch processes. Although not depicted in the supplied figures, at least one gate sidewall spacer composed of a dielectric material may be formed on the sidewalls of the gate structures 7a, 7b. The gate structures 7a, 7b may be formed using a gate first process sequence or gate last process sequence.

Still referring to FIG. 4, source and drain regions 6a, 6b may be formed, in the first and second semiconductor portions 4a, 4b on opposing sides of the channel region portion of the semiconductor device that the gate structures 7a, 7b are present on. The source and drain regions 6a, 6b are typically formed by ion implantation of n-type or p-type dopants, where the conductivity type of the source and drain regions 6a, 6b typically denotes the conductivity type of the device. As used, herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

In some embodiments, the source and drain regions 6a, 6b may further includes well regions 8a, 8b of stress inducing material. For example, the well regions 8a, 8b may be composed of material having an intrinsic tensile or compressive stress, as described in U.S. Pat. No. 7,303,949 titled "High performance stress-enhanced MOSFETs using Si:C and SiGe epitaxial source/drain and method of manufacture", which is incorporated herein by reference in its entirety. For example, epitaxial growth of a material layer on a substrate may impart intrinsic stress to such material layer, if the natural lattice constant of such a material layer is different from the base lattice constant of the substrate. For example, the natural lattice constant of carbon is smaller than that of silicon. Therefore, a Si:C layer epitaxially grown on a silicon substrate contains tensile stress due to tensile distortion of the Si:C crystal lattice. Similarly, the natural lattice constant of germanium is larger than that of silicon, so a SiGe layer epitaxially grown on a silicon substrate contains compressive stress due to compressive distortion of the SiGe crystal lattice. Embedded Si:C or SiGe well regions 8a, 8b with tensile or compressive stress in the source/dram regions 6a, 6b of p-type conductivity semiconductor device 100a or the n-type conductivity semiconductor device 100b provides tensile or compressive stress in the channel region of the p-type conductivity semiconductor device 100a or the n-type conductivity semiconductor device 100b.

For example, the source and dram regions 6a of the p-type conductivity semiconductor devices 100a are first etched, and a highly compressive selective epitaxial SiGe layer is grown in the etched regions of the source and drain regions 6a to apply compressive stress to the adjacent p-FET channel region. Subsequently, the source and dram regions 6b of the n-type conductivity semiconductor devices 100b are etched, and a highly tensile selective epitaxial Si:C layer is grown in the etched regions of the source and drain regions 6b to apply tensile stress to the adjacent n-type conductivity semiconductor devices 100b.

In some embodiments, the source region and drain region 6a, 6b for the p-type conductivity semiconductor device 100a and the n-type conductivity device 100b includes a raised source and drain region 8a, 8b. The raised portion 8a, 8b may be provided by an epitaxially grown semiconductor material. "Epitaxial growth and/or deposition" means the growth of a semiconductor material on a deposition surface of a semiconductor material, in which the semiconductor material being grown has the same crystalline characteristics as the semiconductor material of the deposition surface. Therefore, the material of the raised portions 8a, 8b may be selected to have a different lattice constant that the material of the source and drain regions 6a, 6b to provide a stress inducing material. For example, the material of the raised source and drain regions 8a to the p-type conductivity semiconductor device 100a may be selected to be composed of silicon germanium so that the raised, source and drain regions 8a induce a compressive stress on the channel region portion of the p-type conductivity semiconductor device 100a. In another example, the raised source and drain portions 8b may be composed of silicon doped, with carbon (Si:C) so that the raised source and dram region 8b induce a tensile stress on the channel region portion of the n-type conductivity semiconductor device 100b. The raised portions 8a, 8b of the source and dram region 6a, 6b typically have the same conductivity type as the source and dram region 6a, 6b. The raised portions 8a, 8b of the source and drain region 6a, 6b may be doped by an in-situ dopant process during epitaxial growth and/or may be doped by ion implantation.

In some embodiments, stress inducing layers (not shown) may be formed over the p-type conductivity semiconductor device 100a and the n-type conductivity semiconductor device 100b. In one embodiment, a compressive stress inducing layer may be formed over the p-type semiconductor device 100a. The compressive stress inducing liner may comprise a nitride, an oxide, a doped oxide such as boron phosphate silicate glass, $Al_2O_3$, $HfO_2$, $ZrO_2$, HfSiO, other dielectric materials that are common to semiconductor processing or any combination thereof. The compressive stress inducing layer may have a thickness ranging from 10 nm to 100 nm. The compressive stress inducing layer may be deposited by plasma enhanced chemical vapor deposition (PECVD). In one embodiment, the compressive stress inducing liner comprises a nitride, such as $Si_3N_4$, wherein the process conditions of the deposition process are selected to provide an intrinsic compressive strain within the deposited layer, for example, plasma enhanced chemical vapor deposition (PECVD) can provide nitride stress inducing liners having a compressive intrinsic stress. The stress state of the deposited, nitride stress inducing liner may be set by changing the deposition conditions to alter the reaction rate within the deposition chamber, in which the deposition conditions include $SiH_4/N_2/He$ gas flow rate, pressure, RF power, and electrode gap.

In one embodiment, a tensile stress inducing layer may be formed over the n-type semiconductor device 100b. In one embodiment, the tensile stress inducing layer comprises a nitride, such as silicon nitride ($Si_3N_4$), and is positioned atop the gate structure 7b and the raised portions 8b of the source and drain region structures 6b adjacent to the gate structure 7b. The tensile stress inducing liner may comprise a nitride, an oxide, a doped oxide such as boron phosphate silicate glass, $Al_2O_3$, $HfO_2$, ZrO2, HfSiO, or any combination thereof. The tensile stress inducing liner may have a thickness ranging from about 10 nm to about 500 nm. The tensile stress inducing liner may be deposited by plasma enhanced chemical vapor deposition (PECVD) or rapid thermal chemical vapor deposition (RTCVD). In one embodiment, the tensile stress inducing liner comprises a nitride, such as $Si_3N_4$, wherein the process conditions of the deposition process are selected to provide an intrinsic tensile strain within the deposited layer. For example, plasma enhanced chemical vapor deposition (PECVD) can provide nitride stress inducing liners having an intrinsic tensile strain. The stress state of the nitride stress including liners deposited by PECVD can be controlled by changing the deposition conditions. More specifically, the stress state of the deposited, nitride strain inducing liner may be set by changing the deposition conditions such as: SiH4/N2/He gas flow rate, pressure, RF power, deposition temperature and electrode gap. In another example, rapid thermal chemical vapor deposition (RTCVD) can provide nitride tensile strain inducing liners having an internal tensile strain. The magnitude of the intrinsic tensile strain produced within the nitride tensile strain inducing liner deposited by RTCVD can be controlled by changing the deposition conditions. More specifically, the magnitude of the tensile stress within the nitride tensile stress inducing liner may be set by changing deposition conditions such as: precursor composition, precursor flow rate and temperature.

The aforementioned stress inducing layer, stress inducing wells and stress inducing gate structures are produced during front end of the line (FEOL) processing. In some embodiments, block mask may be employed to individually process specific regions of the substrate 5. In this manner, the p-type conductivity semiconductor device 100a may be processed individually without impacting the processing of the n-type conductivity semiconductor device 100b, and vice versa.

Figure 6:
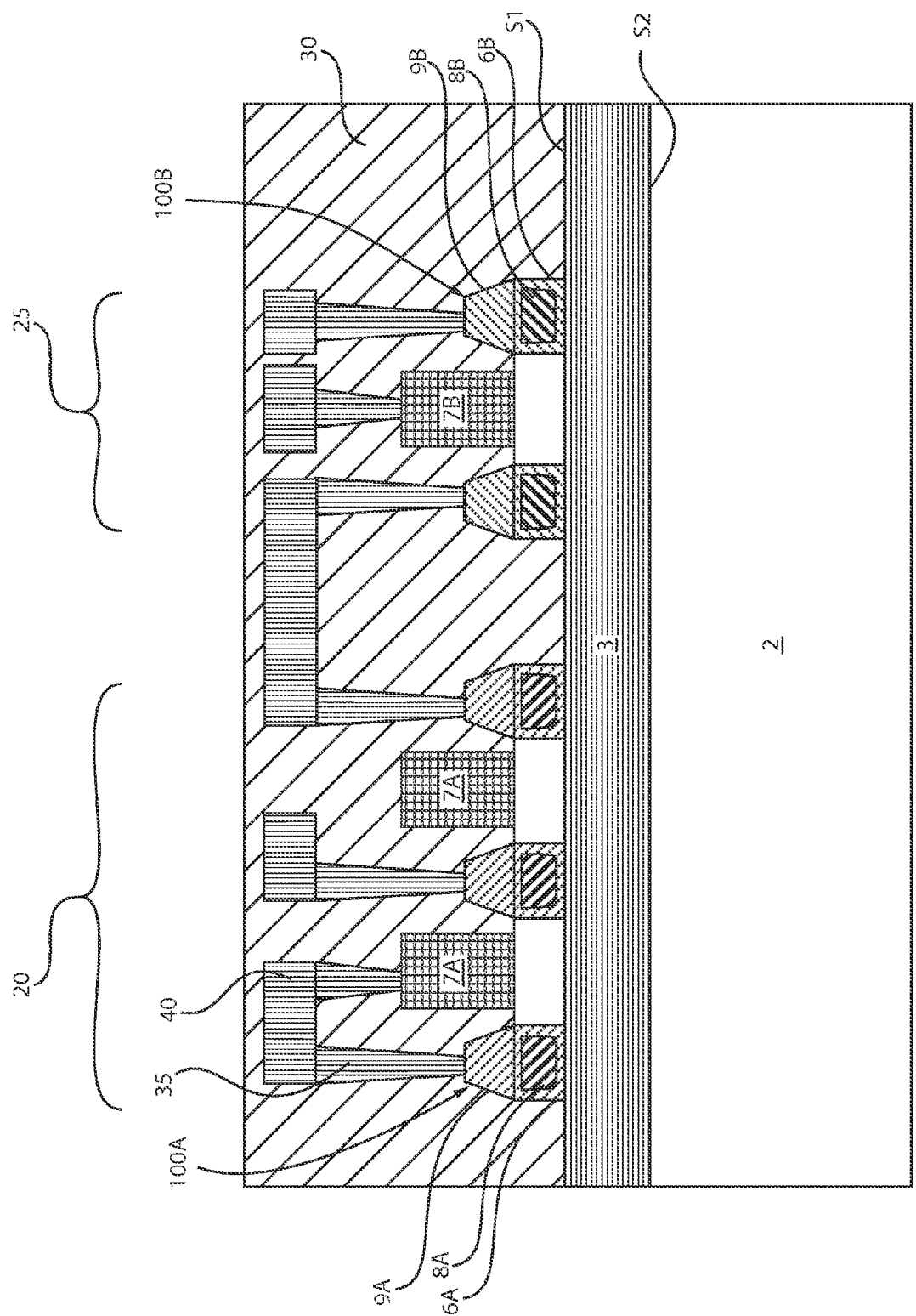
FIG. 6 is a side cross-sectional view depicting one embodiment of forming an interlevel dielectric layer containing lines, vias and interconnects to the first conductivity type semiconductor device and the second conductivity type semiconductor device that are depicted, in FIG. 5.

Referring to FIG. 6, in some embodiments, following formation of the p-type conductivity semiconductor device 100a and the n-type conductivity semiconductor device 100a, an interlevel dielectric layer 30 is formed on the first surface S1 of the dielectric layer 3 positioning the p-type conductivity semiconductor device 100a and the n-type conductivity semiconductor device 100b between the dielectric layer 3 and the interlevel dielectric layer 30. The interlevel dielectric layer 30 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer 30 include any of the aforementioned materials in porous form, or in a form that changes during processing to or from being porous and/or permeable to being non-porous and/or non-permeable.

FIG. 6 further depicts lines 40 and vias 35 (also referred, to as interconnects) that are present in the interlevel dielectric layer 30 to the p-type conductivity semiconductor device 100a and the n-type conductivity semiconductor device 100b. The lines 40 and vias 35 provide electrical communication to the p-type conductivity semiconductor device 100a and the n-type conductivity semiconductor device 100b. In some embodiments, the lines 40 and vias 35 are in electrical communication with the source and drain regions 6a, 6b and the gate structures 7a, 7b of the p-type conductivity semiconductor device 100a and the n-type conductivity semiconductor device 100b. The lines 40 and vias 35 may be formed by depositing conductive materials, such as metal, within etched openings and trenches in the interlevel dielectric layer 30. The conductive material may be a metal selected from the group consisting of tungsten, copper, aluminum, and alloys thereof.

Figure 7:
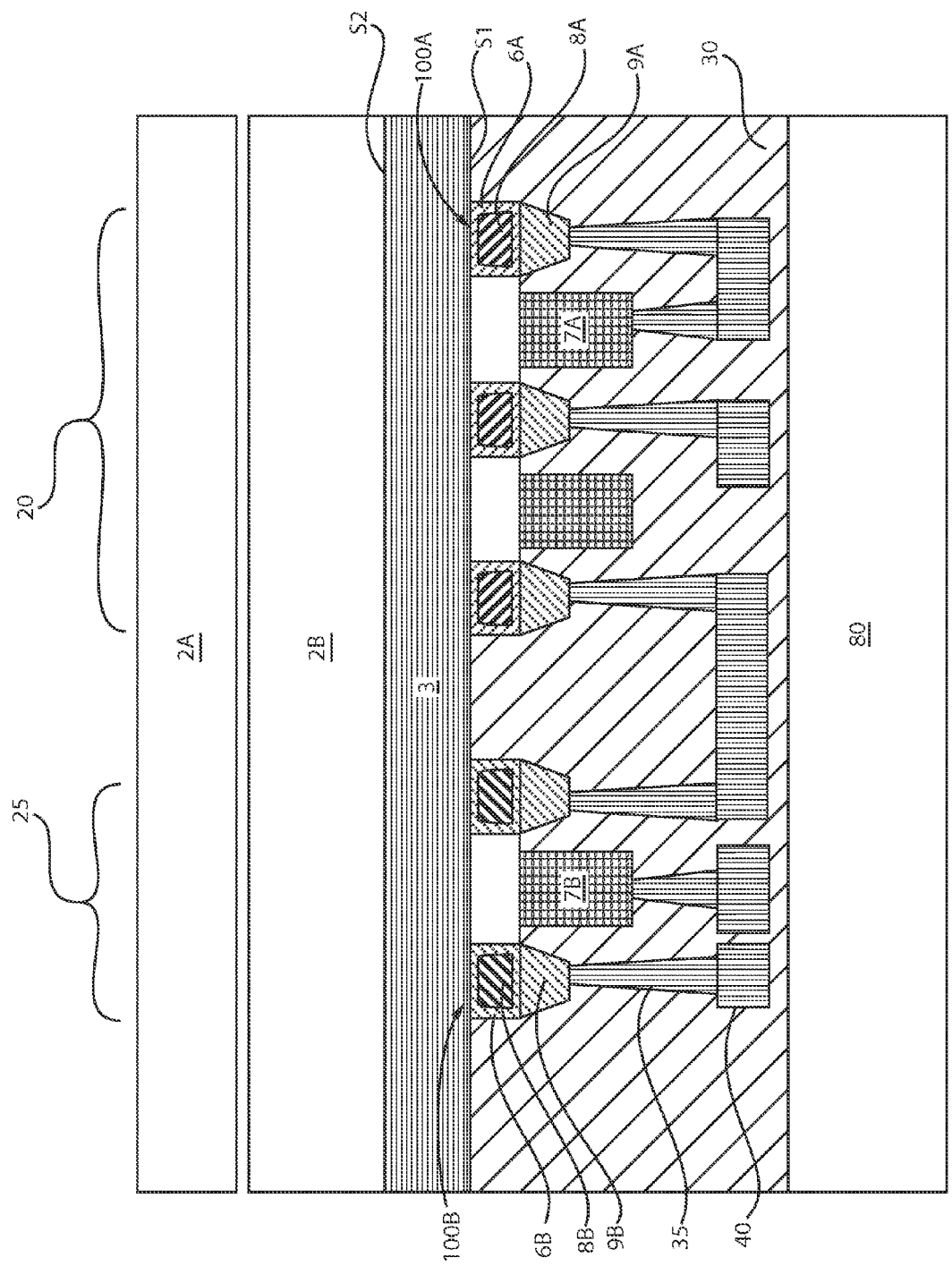
FIG. 7 is a side cross-sectional view depicting bonding the structure containing the first and second conductivity type semiconductor devices to a handle substrate through the interlevel dielectric layer, and removing a portion of the base semiconductor layer of the substrate by spading, in accordance with one embodiment of the present disclosure.
Figure 8:
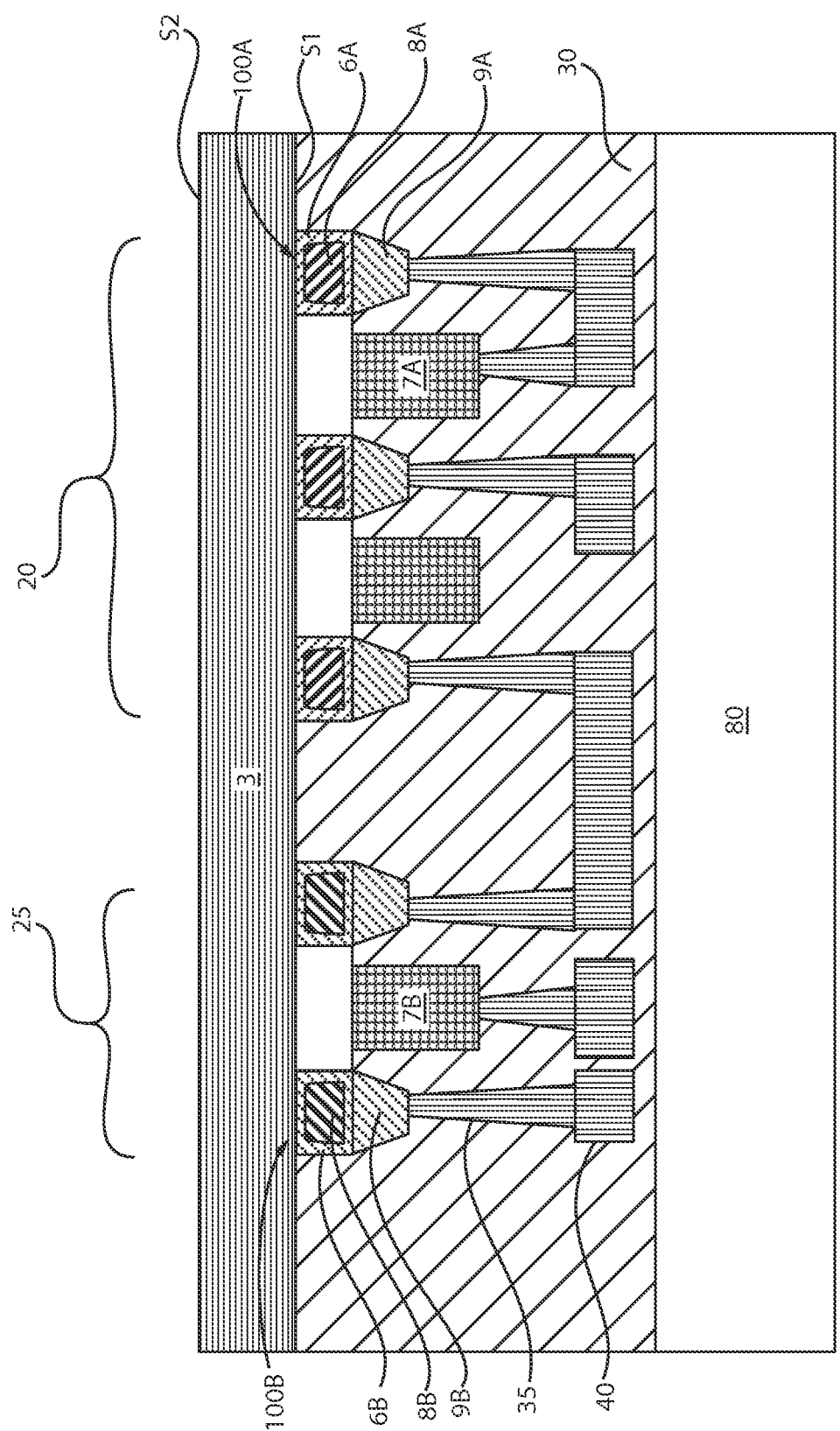
FIG. 8 is a side cross-sectional view depicting removing a remaining portion of the base substrate to expose a surface of the dielectric layer that is opposite the surface of the dielectric layer that the first and second semiconductor portions are present on, in accordance with one embodiment of the present disclosure.
Figure 9:
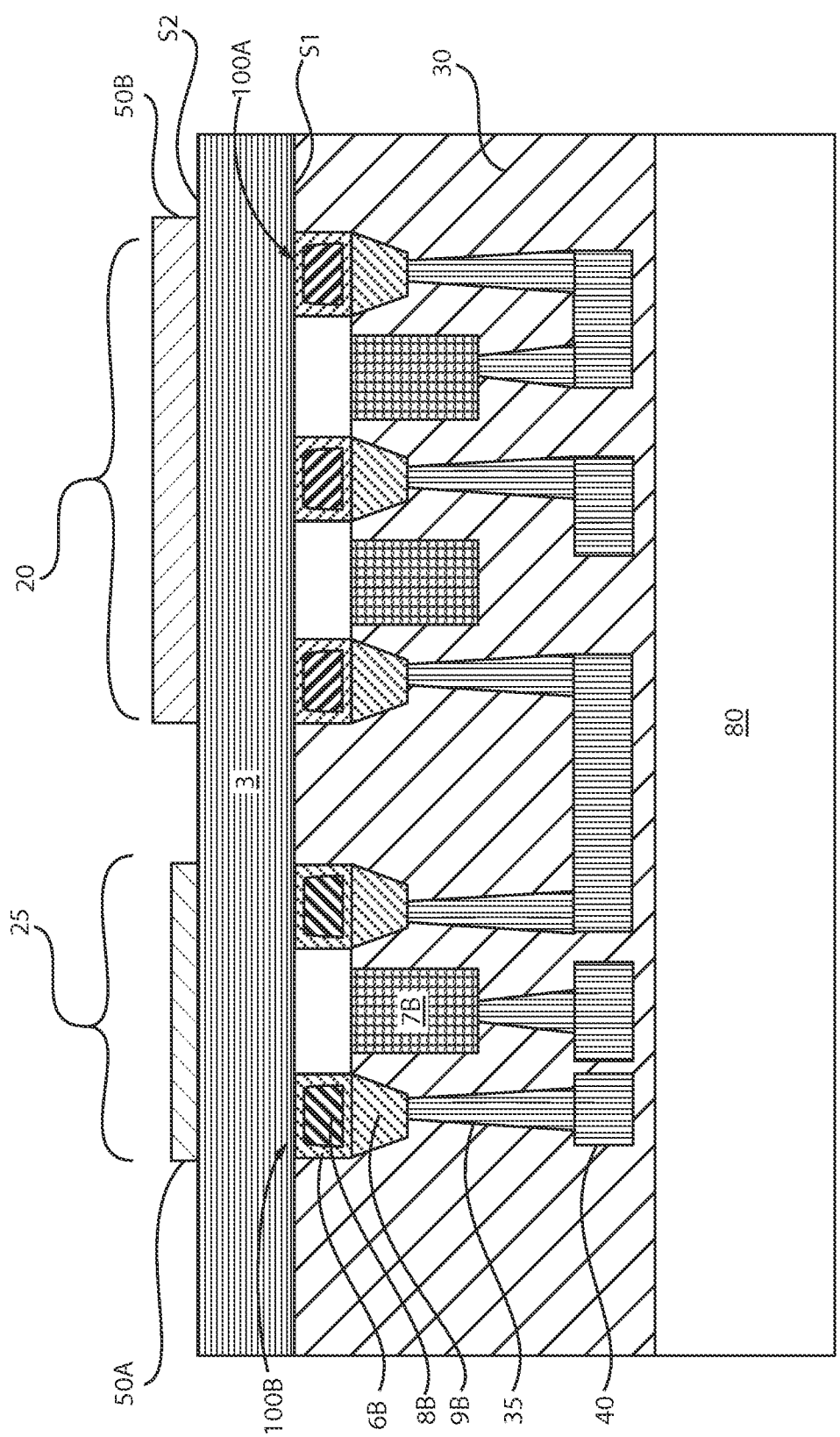
FIG. 9 is a side cross-sectional view depicting one embodiment of forming a first stressor structure in the first region of the dielectric layer and a second stressor structure in the second region of the dielectric layer, wherein the first and second stressor structures are formed on the surface of the dielectric layer exposed by removing the remaining portion of the base semiconductor layer in FIG. 8.

Reference is now made to FIG. 7, which illustrates the structure of FIG. 6 after removing a portion of the base semiconductor layer 2a. The orientation of the structures depicted in FIGS. 7-9 are rotated 180° from the structures depicted in FIGS. 1-6. In one embodiment, spalling is used to remove a portion of the base semiconductor layer 2a. In some of the methods, a handle substrate 80 can be bonded to the interlevel dielectric layer 30 prior to removing a portion of the base semiconductor layer 2a.

When spalling is employed, at least a tensile stressor layer (not depicted) is formed on the exposed surface of the portion of the base semiconductor layer 2a that is to be removed. In some embodiments (not shown), an optional metal-containing adhesion layer can be formed on exposed surface of the exposed surface of the portion of the base semiconductor layer 2a that is to be removed prior to forming the stressor layer so as to improve the adhesion of the stressor layer to the portion of the base semiconductor layer 2a that is to be removed. Typically, the optional metal-containing adhesion layer is employed when a stressor layer comprised of a metal is employed. The optional metal-containing adhesion layer that may be employed in the present disclosure includes any metal adhesion material such as, but not limited to, Ti/W, Ti, Cr or any combination thereof. The optional metal-containing adhesion layer may comprise a single layer or it may include a multilayered structure comprising at least two layers of different metal adhesion materials.

The metal-containing adhesion layer, winch may be optionally employed, can be formed utilizing deposition techniques that are well known to those skilled in the art. For example, the optional metal-containing adhesion layer can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

The optional metal-containing adhesion layer is formed at a temperature which does not effectuate spontaneous spalling to occur within the base semiconductor layer 2. By "spontaneous" it is meant that the removal of a thin material layer from the base semiconductor layer, i.e., portion of base semiconductor layer 2a that is to be removed, occurs without the need to employ any manual means to initiate crack formation and propagation for breaking apart a thin material layer from the base semiconductor layer 2.

The stressor layer that can be employed in the present disclosure to effectuate spalling includes any material that is under tensile stress at the spalling temperature, in accordance with the present disclosure, the stressor layer has a critical thickness and stress value that cause spalling mode fracture to occur within the base semiconductor layer. By "spalling mode fracture" it is meant that a crack is formed within base semiconductor layer and the combination of loading forces maintain a crack trajectory at a depth below the uppermost surface of the base semiconductor layer. By "critical condition", it is meant that for a given stressor material and semiconductor base material combination, a thickness value and a stressor value for the stressor layer is chosen that render spalling mode fracture possible. The spalling process, conditions for spalling, and materials for spalling can include those mentioned within co-pending and commonly owned U.S. Patent Application Publication No, 2010/0307572, and U.S. Patent Application Publication No. 2010/0311250, the entire contents of which are incorporated herein by reference.

Illustrative examples of materials that are under tensile stress when applied atop the base semiconductor layer 2 and thus can be used as the stressor layer in spalling methods include, but are not limited to, a metal, a polymer, such as a spall inducing tape layer, or any combination thereof. In another embodiment, the stressor layer is a spall inducing tape.

When a metal is employed as the stressor layer for spalling, the metal can include, for example, Ni, Mo, Cr, and/or Ti, W. Alloys of these metals can also be employed. When a polymer is employed as the stressor layer, the polymer is a large macromolecule composed of repeating structural units. These subunits are typically connected by covalent chemical bonds. Illustrative examples of polymers that can be employed as the stressor layer include, but are not limited to, polyamides polyesters, polyolefins, polyacrylates, polyurethane, polyvinyl acetate, and polyvinyl chloride. When a spall inducing tape layer is employed as the stressor layer for spalling, the spall inducing tape layer includes any pressure sensitive tape that is flexible, soft, and stress free at a first temperature used to form the tape, yet strong, ductile and tensile at a second temperature used, during spalling. By "pressure sensitive tape," it is meant an adhesive tape that will stick with application of pressure, without the need for solvent, beat, or water for activation. Tensile stress in the tape at the second temperature is primarily due to thermal expansion mismatch between the base semiconductor layer 2 (with a lower thermal coefficient of expansion) and the tape (with a higher thermal expansion coefficient).

In one embodiment and when the stressor layer is a metal or polymer, the stressor layer can be formed by a deposition process such as, for example, dip coating, spin-coating, brush coating, sputtering, chemical vapor deposition, plasma enhanced chemical vapor deposition, chemical solution deposition, physical vapor deposition, and/or plating. When the stressor layer is a spall inducing tape layer, the spall inducing tape layer can be applied by hand or mechanical means.

If the stressor layer for spading is of a metallic nature, it typically has a thickness within a range from 3 µm to 50 µm, with a thickness within a range from 4 µm to 10 µm being more typical. Other thicknesses for a metallic stressor material that are below and/or above the aforementioned thickness ranges can also be employed in the present disclosure. If the stressor layer for spading is of a polymeric nature, it typically has a thickness in a range from 10 µm to 200 µm, with a thickness within a range from 50 µm to 100 µm being more typical. Other thicknesses for a polymeric stressor material that are below and/or above the aforementioned thickness ranges can also be employed in the present disclosure.

After forming the stressor layer, a flexible handle layer (not shown) can be formed on an exposed, surface of the stressor layer. In some embodiments, the flexible handle layer may be omitted. The flexible handle layer employed in the present disclosure comprises any flexible material which has a minimum radius of curvature that is typically less than 30 cm. Illustrative examples of flexible materials that can be employed as the flexible handle layer include a metal foil or a polyimide foil. Alternatively, a tape as described above can be used as the flexible handle layer. The flexible handle layer can be used to provide better fracture control and more versatility in handling the spalled portion of the base semiconductor layer 2a. Moreover, the flexible handle layer can be used to guide the crack propagation during spalling. The flexible handle layer of the present disclosure is typically, but not necessarily, formed at a first temperature which is at room temperature (15° C.-40° C.). In some embodiments, the flexible handle layer typical has a thickness of from 1 µm to few mm, with a thickness of from 70 µm to 120 µm being more typical.

Next, a controlled spalling process can be performed in which a portion of the base semiconductor layer 2a is removed. The portion of the base semiconductor layer 2a that remains attached to the dielectric layer 3 can be referred to as a non-spalled portion of the base semiconductor layer 2b or remaining portion of the base semiconductor layer 2b. In one embodiment of the present disclosure, the remaining portion of the base semiconductor layer 2b can have a thickness of less than 100 microns.

Spalling can be initiated at room temperature or at a temperature that is less than room temperature. In one embodiment, spading is performed at room temperature (i.e., 20° C. to 40° C.). In another embodiment, spalling is performed at a temperature less than 20° C. In a further embodiment, spading occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas. When spalling is performed at a temperature that is below room temperature, the spalled structure is returned to room temperature by allowing the spalled structure to slowly warm up to room temperature by allowing the same to stand at room temperature. Alternatively, the spalled structure can be heated up to room temperature utilizing any heating means.

In lieu of spalling, a standard etching process, and/or a planarization process, such as chemical mechanical polishing and/or grinding can be used for removing the base semiconductor layer 2. It is noted that the present disclosure is not limited to the aforementioned methods for removing the base semiconductor layer 2 that is depicted in FIG. 7.

FIG. 8 depicts one embodiment of removing a remaining portion of the base substrate layer 2b to expose a surface S1 of the dielectric layer 3 that is opposite the surface S1 of the dielectric layer 3 that the first and second semiconductor portions 4a, 5b are present on. In some embodiments, the remaining portion of the base substrate 2b may be removed using a selective etch process. As used herein, the term "selective" in reference to a material removal process denotes that the rate of material removal for a first material is greater than the rate of removal for at least another material of the structure to which the material removal process is being applied. For example, in one embodiment a selective etch may include an etch chemistry that removes a first material selectively to a second material by a ratio of 100:1 or greater. The selective etch process for removing the remaining portion of the base semiconductor layer 2b may be at least one of plasma etching, reactive ion etching and wet chemical etching.

FIG. 9 depicts one embodiment of forming a first stressor structure 50a in the first region 20 of the dielectric layer 3 and forming a second stressor structure 50b in the second region 25 of the dielectric layer 3, wherein the first and second stressor structures 50a, 50b are formed on the surface S2 of the dielectric layer 3 (also referred to as second surface) exposed by removing the remaining portion 2b of the base semiconductor layer in FIG. 8. Each of the first stressor structure 50a and the second stressor structure 50b have an intrinsic stress that induces an opposing stress to the channel region portion of their corresponding semiconductor device, i.e., p-type conductivity semiconductor device 100a and n-type conductivity semiconductor device 100b. For example, the first stressor structure 50a has an intrinsic tensile stress that induces a compressive stress in the channel region portion of the p-type conductivity semiconductor device 100a, and the second stressor structure 100b has an intrinsic compressive stress that induces a tensile stress in the channel region portion of the n-type conductivity semiconductor device 100b.

In one embodiment, the first stressor structure 50a is composed of a dielectric material having an intrinsic tensile stress. For example, the first stressor structure 50 having the intrinsic tensile stress may be composed of a nitride, an oxide, a doped oxide such as boron phosphate silicate glass, $Al_2O_3$, $HfO_2$, $ZrO_2$, HfSiO, or any combination thereof. In one embodiment, the first stressor structure 50a is composed of a nitride, such as silicon nitride ($Si_3N_4$). In some embodiments, to provide a first stressor structure 50a of silicon nitride ($Si_3N_4$) having an intrinsic tensile stress, a material layer of silicon nitride may be directly deposited on the second surface S2 of the dielectric layer 3 using a chemical vapor deposition process, such as plasma enhanced chemical vapor deposition (PECVD) or rapid thermal chemical vapor deposition (RTCVD). The stress state of the nitride material layer being deposited by PECVD can be controlled by changing the deposition conditions to alter the reaction rate within the deposition chamber. More specifically, the stress state of the deposited nitride material layer for the first stressor structure 50a having the intrinsic tensile stress may be set by changing the deposition conditions such as: $SiH_4/N_2$/He gas flow rate, pressure, RF power, temperature, and electrode gap. In another example, rapid thermal chemical vapor deposition (RTCVD) can provide nitride materials having an intrinsic tensile strain. The magnitude of the intrinsic tensile stress produced within the nitride material deposited by RTCVD can be controlled by changing the deposition conditions. More specifically, the magnitude of the tensile intrinsic stress within the deposited nitride layer, i.e., silicon nitride ($Si_3N_4$) layer, may be set by changing deposition conditions, such as precursor composition, precursor flow rate and temperature.

The material layer having the intrinsic tensile stress for the first stressor structure 50a may be blanket deposited on the entire surface S2 of the dielectric layer 3 that is opposing the surface S1 of the dielectric layer 3 that the semiconductor portions 4a, 4b containing the p-type conductivity semiconductor device 100a and the n-type conductivity semiconductor device 100b are present on. Following deposition of the material layer having the intrinsic tensile stress for the first stressor structure 50a on the entire surface S2 of the dielectric layer 3, the material layer may be patterned and etched so that a remaining portion of the material layer having the intrinsic tensile stress for the first stressor structure 50a is present only in the first region 20 of the dielectric layer 3. By being positioned in the first region 20 of the dielectric layer 3, the first stressor structure 50a is present underlying the p-type conductivity semiconductor device 100a, wherein the first stressor structure 50a induces a compressive stress on the channel region of the p-type conductivity semiconductor device 100a.

In one embodiment, the second stressor structure 50b is composed of a dielectric having an intrinsic compressive stress. The dielectric material that provides the second stressor structure 50b may comprise a nitride, an oxide, a doped oxide, such as boron phosphate silicate glass, $Al_2O_3$, $HfO_2$, $ZrO_2$, HfSiO, other dielectric materials that are common to semiconductor processing or any combination thereof. In one embodiment, the second stressor structure 50b is composed of a nitride, such as silicon nitride ($Si_3N_4$). In some embodiments, to provide a second stressor structure 50b of silicon nitride ($Si_3N_4$) having an intrinsic compressive stress, a material layer of silicon nitride may be directly deposited on the second surface S2 of the dielectric layer 3 using a chemical vapor deposition process, such as plasma enhanced chemical vapor deposition (PECVD) or rapid, thermal chemical vapor deposition (RTCVD). The stress state of the deposited nitride stress inducing material may be set by changing the deposition conditions to alter the reaction rate within the deposition chamber, in which the deposition conditions include $SiH_4/N_2$/He gas flow rate, pressure, RF power, and electrode gap. Further details on the depositions conditions for depositing metals having an intrinsic compressive stress or intrinsic tensile stress are described in more detail in W. A. P. Claassen, et al. *Influence of Deposition Temperature, Gas Pressure, Gas Phase Composition, and RF Frequency on the Composition and Mechanical Stress of Plasma Silicon Nitride layers*. Vol, 132, J. Electrochemical society, p. 893, (1985), which is incorporated herein in its entirety by reference.

The material layer having the intrinsic compressive stress for the second stressor structure 50b may be formed after the first stressor structure 50a has been deposited in the first region 20 of the dielectric layer 3. In this example, prior to depositing the material layer having the intrinsic compressive stress for the second stressor structure 50b, a block mask (not shown) may be formed in the first region 20 of the dielectric layer 3 covering the first stressor structure 50a. The block mask protects the first stressor structure 50a during the process sequence for forming the second stressor structure 50b. The block mask may be composed of a photoresist material. For example, to provide a photoresist block mask, a layer of photoresist material may be deposited on the second surface S2 of the dielectric layer 3 and patterned using photolithography and development process steps. The photoresist material may be patterned and developed so that the first stressor structure 50a that is present in the first region 20 of the dielectric layer 3 is covered and protected by the photoresist material, while at least the second region 25 of the dielectric layer 3 is exposed. The material layer having the intrinsic compressive stress is then formed on the second surface S2 in the second region 25 of the dielectric layer 3 to provide the second stressor structure 50b. By being positioned in the second region 25 of the dielectric layer 3, the material layer having the intrinsic compressive stress that provides the second stressor structure 50b is present underlying the n-type conductivity semiconductor device 100b, wherein the second stressor structure 50b induces a tensile stress on the channel region of the n-type conductivity semiconductor device 100b.

It is noted, the first and second stressor structures 50a, 50b are not limited to being composed of only dielectric materials. For example, the first and second stressor structures 50a, 50b may also be composed of a metal having an intrinsic stress therein. For example, the first stressor structure 50a may be a metal having an intrinsic tensile stress that induces a compressive stress in the channel region of the p-type conductivity semiconductor device 100a, and the second stressor structure 50b may be a metal having an intrinsic compressive stress that includes a tensile stress in the channel region of the n-type conductivity semiconductor device 100b.

Examples of metals that can provide the first stressor structure 50a may be selected from the group consisting of nickel (Ni), tantalum (Ta), cobalt (Co), tungsten (W), titanium (Id), and combinations thereof. The first stressor structure 50a is typically formed using a sputtering process. As used herein, "sputtering" means a method of depositing a film of material on a semiconductor surface. A target of the desired material, i.e., source, is bombarded with particles, e.g., ions, winch knock atoms from the target, and the dislodged target material deposits on the semiconductor surface. Sputtering methods suitable for forming the first stressor structure 50a include DC diode type systems, radio frequency (RF) sputtering, magnetron sputtering, and ionized metal plasma (IMP) sputtering. To provide a first stressor structure 50a having an intrinsic tensile stress, the sputtering process for depositing the metal material may be configured to in which the sputtering gas pressure is selected to provide an intrinsic tensile stress in the deposited metal. Substrate biasing may also dictate whether the sputtered metal has in intrinsic tensile stress. Substrate biasing and variations in the sputtering gas pressure for producing a first stressor structure 50a of sputtered metal has been described in greater detail in Andrew J. Detor, et al., *Stress and microstructure evolution in thick sputtered films,* 57 Acta Materialia, 2055-2065 (2009), which is incorporated herein in its entirety by reference. For example, in one embodiment, a first stressor structure 50a having an intrinsic tensile stress may be provided, by a sputtering process employing a sputtering gas pressure of 5 mTorr or less.

Examples of metals that can provide the second stressor structure 50b may be selected from the group consisting of nickel (Ni), tantalum (Ta), cobalt (Co), tungsten (W), titanium (Ti), and combinations thereof. The second stressor structure 50b is typically formed using a sputtering process. Sputtering methods suitable for forming the second stressor structure 50b include IX diode type systems, radio frequency (RF) sputtering, magnetron sputtering, and ionized metal plasma (IMP) sputtering. To provide a second, stressor structure 50b having an intrinsic compressive stress, the sputtering process for depositing the metal material may be configured, to have a higher sputtering gas pressure than the sputtering gas pressure that provides an intrinsic tensile stress. Substrate biasing may also impact the formation of a second stressor structure 50b having an intrinsic compressive stress that is formed by sputtering. For example, substrate biasing and variations in the sputtering gas pressure for producing a second stressor structure 50b of sputtered metal has been described in greater detail in Andrew J. Detor, et al., *Stress and microstructure evolution in thick sputtered films,* 57 Acta Materialia, 2055-2065 (2009), which is incorporated, herein in its entirety by reference. For example, in one embodiment, a second stressor structure 50b having an intrinsic compressive stress may be provided by a sputtering process employing a sputtering gas pressure of 5 mTorr or more.

Similar to the above described embodiments utilizing stressor structures 50a, 50b composed of dielectrics, block masks and etch processing may be employed to provide for independent processing of the first region 20 and the second region 25 so that the first stressor structure 50a having an intrinsic tensile stress is present in the first region 20 of the dielectric layer 3, and that the second stressor structure 50b having an intrinsic compressive stress is present in the second region 25 of the dielectric layer 3. In this example, the first stressor structure 50a of the metal having the intrinsic tensile stress induces a compressive stress on the channel region portion of the p-type conductivity semiconductor device 100a, and the second stressor structure 50b of the metal having the intrinsic compressive stress induces a tensile stress on the channel region portion of the n-type conductivity semiconductor device 100b.

The stressor structures 50a, 50b depicted being formed in FIG. 9 are typically formed after the interlevel dielectric layer 30, the lines 40 and vias 35. Therefore, the stressor structures 50a, 50b may be referred to as structures formed during or alter back end of the line (BEOL) processing of the semiconductor devices, i.e., p-type conductivity semiconductor device 100a and n-type conductivity semiconductor device 100b.

Figure 10A:
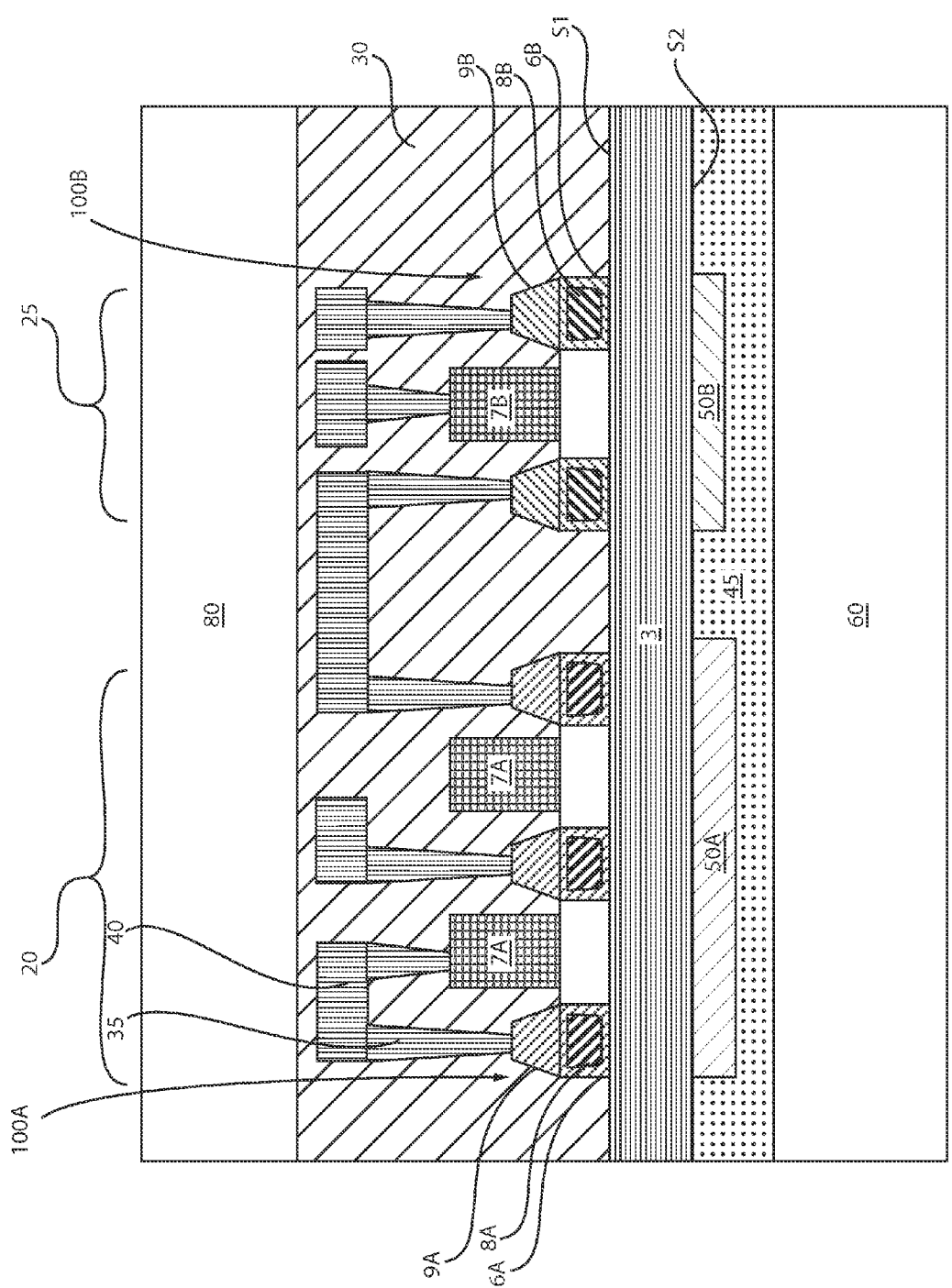
FIG. 10A is a side cross-sectional view depicting one embodiment of forming a bonding layer on the back side surface of the dielectric layer depicted in FIG. 9, wherein the first and second stressor structures are positioned between the dielectric layer and the bonding layer, and bonding the structure to a surrogate substrate.

FIG. 10A depicts one embodiment of forming a bonding layer 45 on the back side surface S2 of the dielectric layer 3 depicted in FIG. 9, wherein the first and second stressor structures 50a, 50b are positioned between the dielectric layer 3 and the bonding layer 45. The bonding layer 45 may be an adhesive. In other embodiments, the bonding layer may be a dielectric material, such as an oxide, nitride or oxynitride material. FIG. 10A further depicts the bonding layer 45 being engaged to a support substrate 60. The support substrate 60 may be composed of a metal, polymer, glass, semiconductor, dielectric or a combination of the aforementioned materials. In some embodiments, the boding layer 45 may be engaged to the support substrate 60 by bringing the two structures into contact and heating the contacted structures to effectuate bonding, optionally with the application of pressure. In the embodiment that is depicted in FIG. 10A, the stressor structures 50a, 50b may be composed of dielectric or metal materials.

Figure 10B:
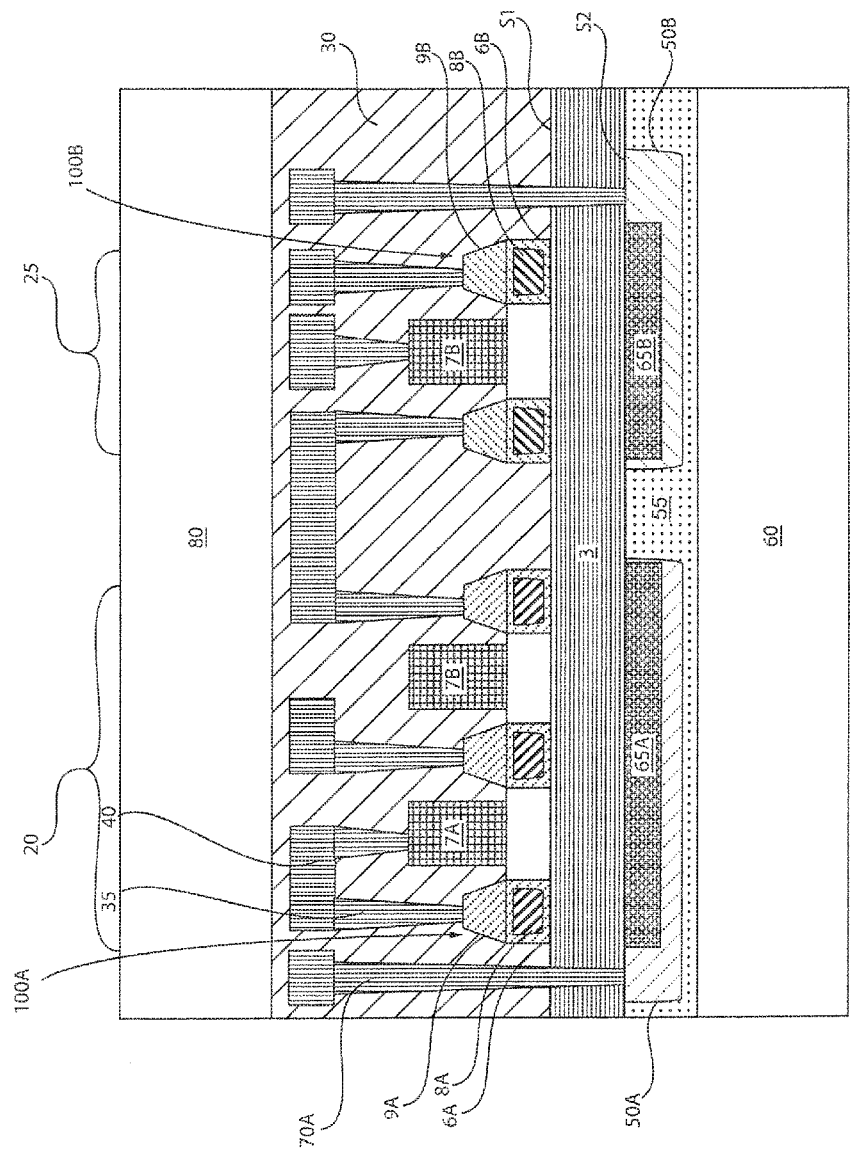
FIG. 10B is a side cross-sectional view depicting one embodiment of forming a semiconductor layer including well regions on the back side surface of the dielectric layer depicted in FIG. 9, wherein the well regions are in electrical communication with the stressor structures, in accordance with one embodiment of the present disclosure.

FIG. 10B depicts another embodiment of semiconductor devices 100a, 100b including metal stressor structures 50a, 50b, in which the stressor structures 50a, 50b also function as a component of back gate structures to the semiconductor devices 100a, 100b. In the embodiment that is depicted in FIG. 10B, the stressor structures 50a, 50b are composed of a conductive material, such as a metal, to provide the gate conductor of the back gate structure. A dielectric layer 55 encapsulates conductive well regions 65a, 65b present therein and, provides electrical communication to the stressor structures 50a, 50b that provide the gate conductor of the back gate structure for each of the semiconductor devices 100a, 100b. The dielectric layer 55 may be deposited on the second surface S2 of the dielectric layer 3 positioning the stressor structures 50a, 50b between the dielectric layer 3 and the dielectric layer 55. The dielectric layer 55 depicted in FIG. 10B is bonded to a support substrate 60 similar to the bonding layer 45 being bonded to the support substrate depicted in FIG. 10A.

In a following process sequence, the handle substrate 80 may be removed from the structures depicted in FIGS. 10A and 10B to provide the structures described above with reference to FIGS. 1 and 2. The handle substrate 80 may be removed by a selective etch process or a planarization processes.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device comprising:
   forming at least one p-type conductivity type semiconductor device in a first region of a dielectric layer and at least one n-type conductivity type device on a second region of the dielectric layer;
   forming a first stressor structure corresponding to the first region of the dielectric layer;
   forming a second stressor structure corresponding to the second region of the dielectric layer,
   forming first and second doped well-regions within the first and second stressor structures, respectively,
   forming a first via extending to and contacting the first stressor structure, without contacting the first doped well-region, to enable electrical communication between the at least one p-type conductivity type semiconductor device and the first stressor structure; and
   forming a second via extending to and contacting the second stressor structure, without contacting the second doped well-region, to enable electrical communication between the at least one n-type conductivity type semiconductor device and the second stressor structure;
   wherein the first doped well-region and the first stressor structure collectively act as a first backgate to the at least one p-type conductivity type semiconductor device, and the second doped well-region and the second stressor structure collectively act as a second backgate to the at least one n-type conductivity type semiconductor device, and
   wherein the first stressor structure includes an intrinsic tensile stressor structure comprising a tensile layer in the first region of the dielectric layer for inducing a compressive stress on the p-type conductivity type semiconductor device and the second stressor structure includes an intrinsic compressive stressor structure comprising a compressive layer in the second region of the dielectric layer for inducing a tensile stress on the n-type conductivity type semiconductor device.

2. The method of claim 1, wherein said forming the at least one semiconductor device comprises:
   providing a semiconductor on insulator (SOI) substrate, wherein a buried insulating layer of the SOI substrate provides the dielectric layer;
   patterning a semiconductor layer of the SOI substrate to provide said first semiconductor island on the first region of the dielectric layer that is isolated from said second semiconductor island on the second region of the dielectric layer;
   forming the p-type conductivity type semiconductor device on the first semiconductor portion in the first device region; and
   forming the n-type conductivity type semiconductor device on the second semiconductor portion in the second device region.

3. The method of claim 2, further comprising forming an interlevel dielectric layer on the p-type conductivity type semiconductor device and the n-type conductivity type semiconductor device.

4. The method of claim 3 further comprising:
   bonding a handling substrate to the interlevel dielectric layer;
   cleaving a base semiconductor layer of the SOI substrate to remove a first portion of the base semiconductor layer, wherein a second portion of the base semiconductor layer remains on the surface of the dielectric layer; and
   removing the second portion of the base semiconductor layer.

* * * * *